United States Patent
Park et al.

(10) Patent No.: US 10,901,905 B2
(45) Date of Patent: Jan. 26, 2021

(54) SYSTEM AND METHOD FOR CREATING TIME-ACCURATE EVENT STREAMS

(71) Applicant: IEX Group, Inc., New York, NY (US)

(72) Inventors: Robert Park, New York, NY (US); Daniel Charles Aisen, New York, NY (US); Allison Breton Bishop, New York, NY (US); Prerak P. Sanghvi, Jersey City, NJ (US); Beau Seichi Tateyama, Astoria, NY (US); James M. Cape, New York, NY (US); Francis Chung, New York, NY (US); Constantine Sokoloff, Jersey City, NJ (US)

(73) Assignee: IEX Group, Inc., New York, NY (US)

(*) Notice: Subject to any disclaimer, the term of this patent is extended or adjusted under 35 U.S.C. 154(b) by 0 days.

(21) Appl. No.: 16/872,647

(22) Filed: May 12, 2020

(65) Prior Publication Data

US 2020/0272569 A1   Aug. 27, 2020

Related U.S. Application Data

(63) Continuation of application No. 15/687,707, filed on Aug. 28, 2017, now Pat. No. 10,678,694.

(60) Provisional application No. 62/382,911, filed on Sep. 2, 2016.

(51) Int. Cl.
| | | |
|---|---|---|
| *G06F 15/173* | (2006.01) | |
| *G06F 12/0868* | (2016.01) | |
| *G06F 9/54* | (2006.01) | |
| *G01R 22/06* | (2006.01) | |
| *H04L 29/06* | (2006.01) | |

(Continued)

(52) U.S. Cl.
CPC ....... *G06F 12/0868* (2013.01); *G01R 22/063* (2013.01); *G06F 9/542* (2013.01); *G06F 9/546* (2013.01); *H04L 29/06* (2013.01); *H04L 67/12* (2013.01); *G05B 2219/33149* (2013.01); *G06F 2015/765* (2013.01); *H04L 67/06* (2013.01); *H04L 67/2842* (2013.01)

(58) Field of Classification Search
CPC ...... G06F 12/0868; G06F 9/542; G06F 9/546; G06F 2015/765; G01R 22/063; H04L 29/06; H04L 67/06; H04L 67/12; H04L 67/2842; G05B 2219/33149
USPC ........................................................ 709/230
See application file for complete search history.

(56) References Cited

U.S. PATENT DOCUMENTS

| | | | | |
|---|---|---|---|---|
| 7,162,510 B2 * | 1/2007 | Jammes | ............... | H04L 12/403 709/203 |
| 7,162,524 B2 * | 1/2007 | Astley | .................. | H04L 67/306 709/224 |

(Continued)

*Primary Examiner* — Alicia Baturay
(74) *Attorney, Agent, or Firm* — Goodwin Procter LLP

(57) ABSTRACT

Embodiments of the present invention may provide an improved distributed computing system. Entities in the distributed computing system may be divided into four categories: writers, readers, gateways, and applications. End users may interact with the system via the applications through the gateways. The role of writers and readers may be separated to distribute computational burdens. Writers may generate messages for an event stream. The messages may include a timestamp for consistent global ordering. The readers may arrange messages from various writers based on the timestamps to generate globally time-consistent event streams.

24 Claims, 7 Drawing Sheets

(51) Int. Cl.
*H04L 29/08* (2006.01)
*G06F 15/76* (2006.01)

(56) References Cited

U.S. PATENT DOCUMENTS

| | | | | |
|---|---|---|---|---|
| 7,487,216 B2* | 2/2009 | Miller | ............... | G06F 9/451 |
| | | | | 709/206 |
| 7,621,447 B1* | 11/2009 | Sarma | ............ | G06Q 10/087 |
| | | | | 235/385 |
| 7,680,838 B1* | 3/2010 | Shaw | ............ | G06F 16/1734 |
| | | | | 707/610 |
| 8,014,296 B1* | 9/2011 | Chisholm | ............ | H04J 3/1611 |
| | | | | 370/241.1 |
| 8,150,988 B2* | 4/2012 | Pardo-Castellote | .... | H04L 29/06 |
| | | | | 709/230 |
| 8,392,473 B2* | 3/2013 | Thomson | ............ | G06F 16/248 |
| | | | | 707/805 |
| 9,137,329 B2* | 9/2015 | Xu | ............ | G06Q 50/01 |
| 9,553,831 B2* | 1/2017 | Pignataro | ............ | H04L 51/046 |
| 9,612,888 B2* | 4/2017 | Marappan | ............ | G06F 9/542 |
| 9,712,606 B2* | 7/2017 | Farnlof | ............ | G06F 9/542 |
| 9,973,306 B2* | 5/2018 | Bray | ............ | H04L 41/069 |
| 10,678,694 B2* | 6/2020 | Park | ............ | H04L 67/12 |
| 2006/0146991 A1* | 7/2006 | Thompson | ............ | G06F 9/542 |
| | | | | 379/67.1 |
| 2012/0221396 A1* | 8/2012 | Eglen | ............ | G06Q 30/0206 |
| | | | | 705/14.24 |
| 2014/0025321 A1* | 1/2014 | Spanier | ............ | G01R 22/063 |
| | | | | 702/62 |

* cited by examiner

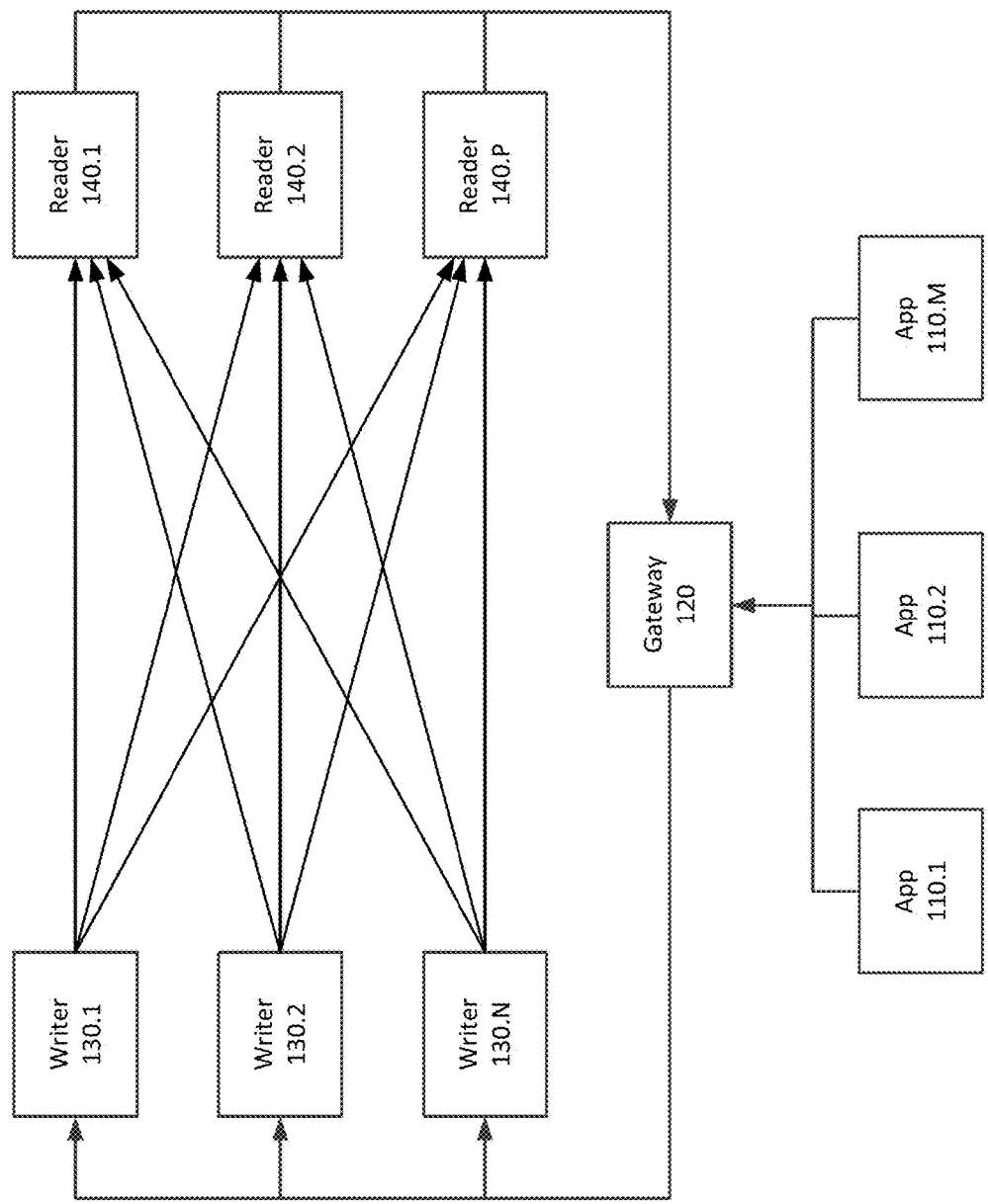

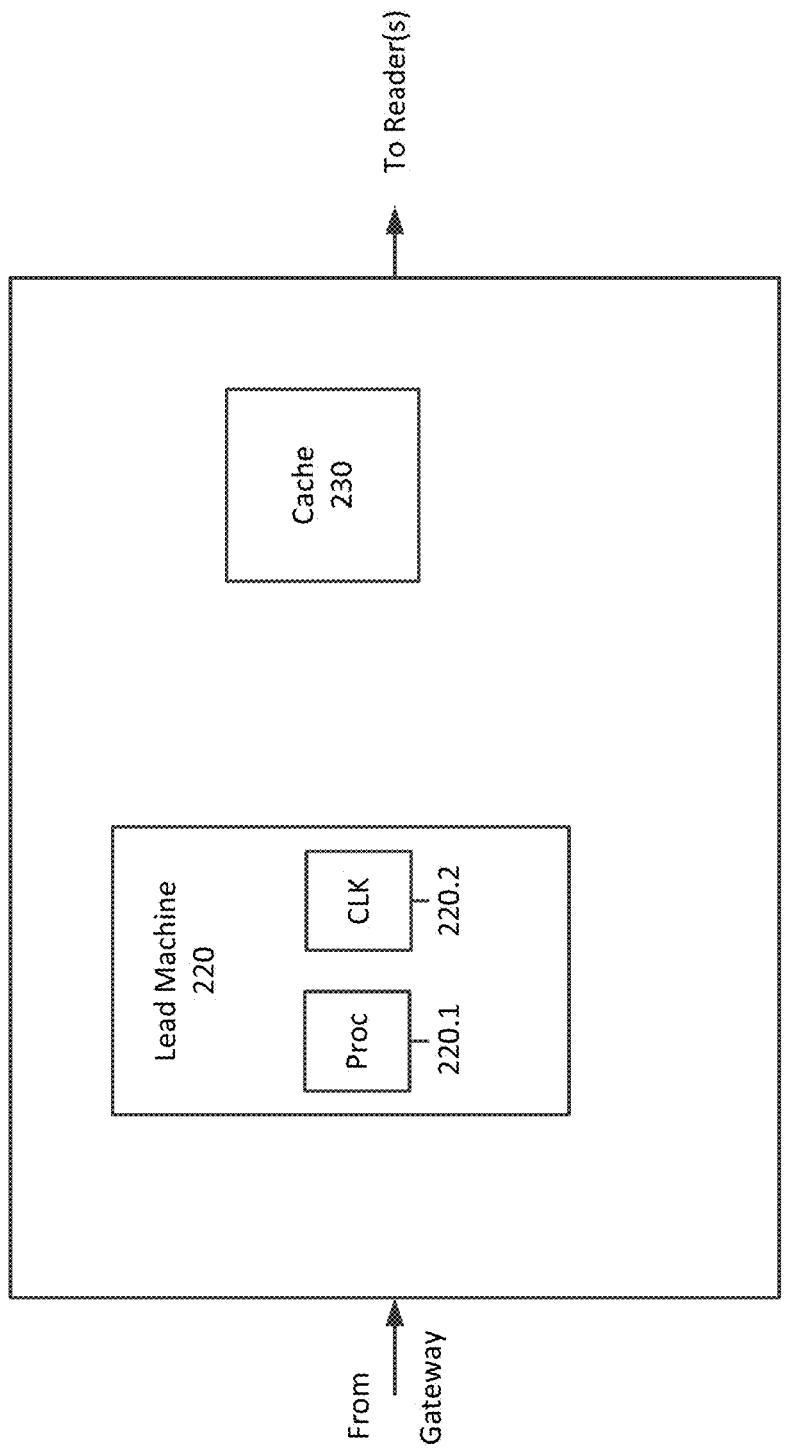

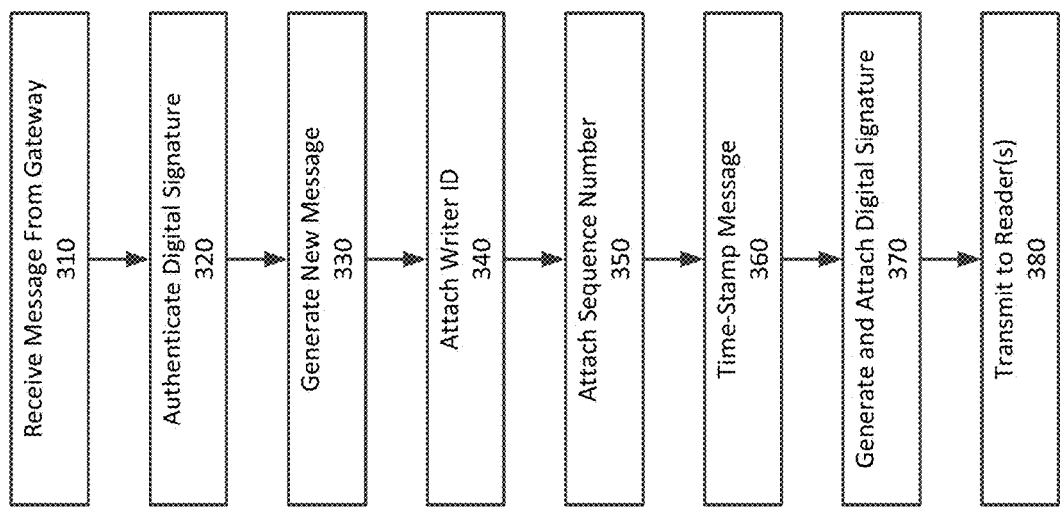

400

400

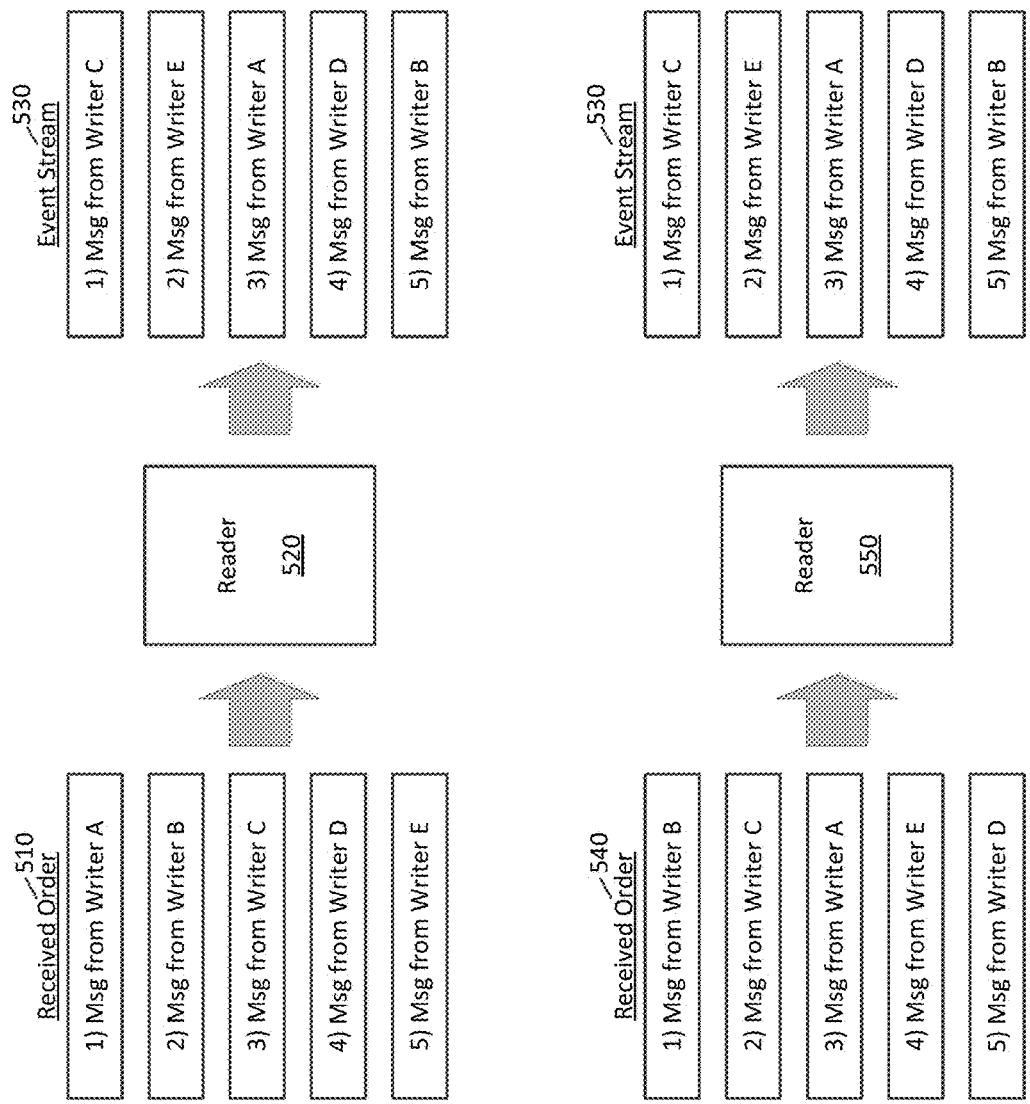

SYSTEM AND METHOD FOR CREATING TIME-ACCURATE EVENT STREAMS

RELATED APPLICATION

This application is a continuation of and claims priority to U.S. patent application Ser. No. 15/687,707 filed Aug. 28, 2017, which claims priority to U.S. Provisional Application No. 62/382,911 filed Sep. 2, 2016, both entitled "System and Method for Creating Time-Accurate Event Streams," the contents of which are incorporated by reference herein in their entireties.

FIELD OF THE INVENTION

Embodiments of the present invention are generally related to systems and methods for using a distributed computer network to create time-accurate event streams.

BACKGROUND OF THE INVENTION

Most complex computing these days is performed in a centralized fashion. For instance, users from different locations for a given application interact with a central processor, and the central processor handles all processing functions related to the application. An example is a gaming environment where multiple users from across the world log onto a central server and play an interactive game together. Each user transmits its instructions to the central server, and the central server, based on the order of the user instructions, will execute the instructions. With weapons aimed at each other in the game, Player A pressed the shoot button before Player B, so Player A lives and Player B dies. Centralized computing has limits, however. For one, throughput is restricted by the use of a single processor. The throughput of a centralized system can never be more than the throughput of the single central processor.

Distributed computing provides an alternative to centralized computing. In distributed computing, multiple nodes, rather than a single node, can be used at the same time to process an application. However, distributed computing suffers from drawbacks such as double spend. Since multiple nodes may process different instructions, the nodes must agree to an order of events. For example, consider a seller posts an offer for a product online. Buyer A in China transmits an acceptance to the offer, and that acceptance is processed by Node 1 located in China. Around the same time, another buyer in the United States, Buyer B, also transmits an acceptance to the offer, and that acceptance is processed by Node 2 located in the United States. Nodes 1 and 2 may disagree about who accepted the offer first, Buyer A or Buyer B.

Conventional solutions to ordering events in a distributed computing environment have fallen short. For example, consensus algorithms, such as Paxos and Raft, involve heavy coordination between the participants to ensure agreement of the order of events. This leads to low throughput. Another conventional solution such as the algorithm for Bitcoin relies upon proof-of-work rather than explicit coordination to achieve agreement on the order of events. This, however, results in long latencies, as well as low throughput.

Accordingly, the inventors recognized a need in the art for distributed computer network with consistent global ordering events in close to real time that achieves high throughput and low latency.

BRIEF DESCRIPTION OF THE DRAWINGS

In order to facilitate a fuller understanding of the present invention, reference is now made to the accompanying drawings, in which like elements are referenced with like numerals. These drawings should not be construed as limiting the present invention, but are intended to be exemplary only.

FIG. 1A is a block diagram illustrating part of a distributed computing network in accordance with an embodiment of the invention.

FIG. 2 is a block diagram of a writer device in accordance with an embodiment of the present invention.

FIG. 3 is a flow diagram of operations of a writer device in accordance with an embodiment of the present invention.

FIG. 5 illustrates an example of a reader operation in accordance with an embodiment of the present invention.

DETAILED DESCRIPTION OF THE INVENTION

Figure 1B:
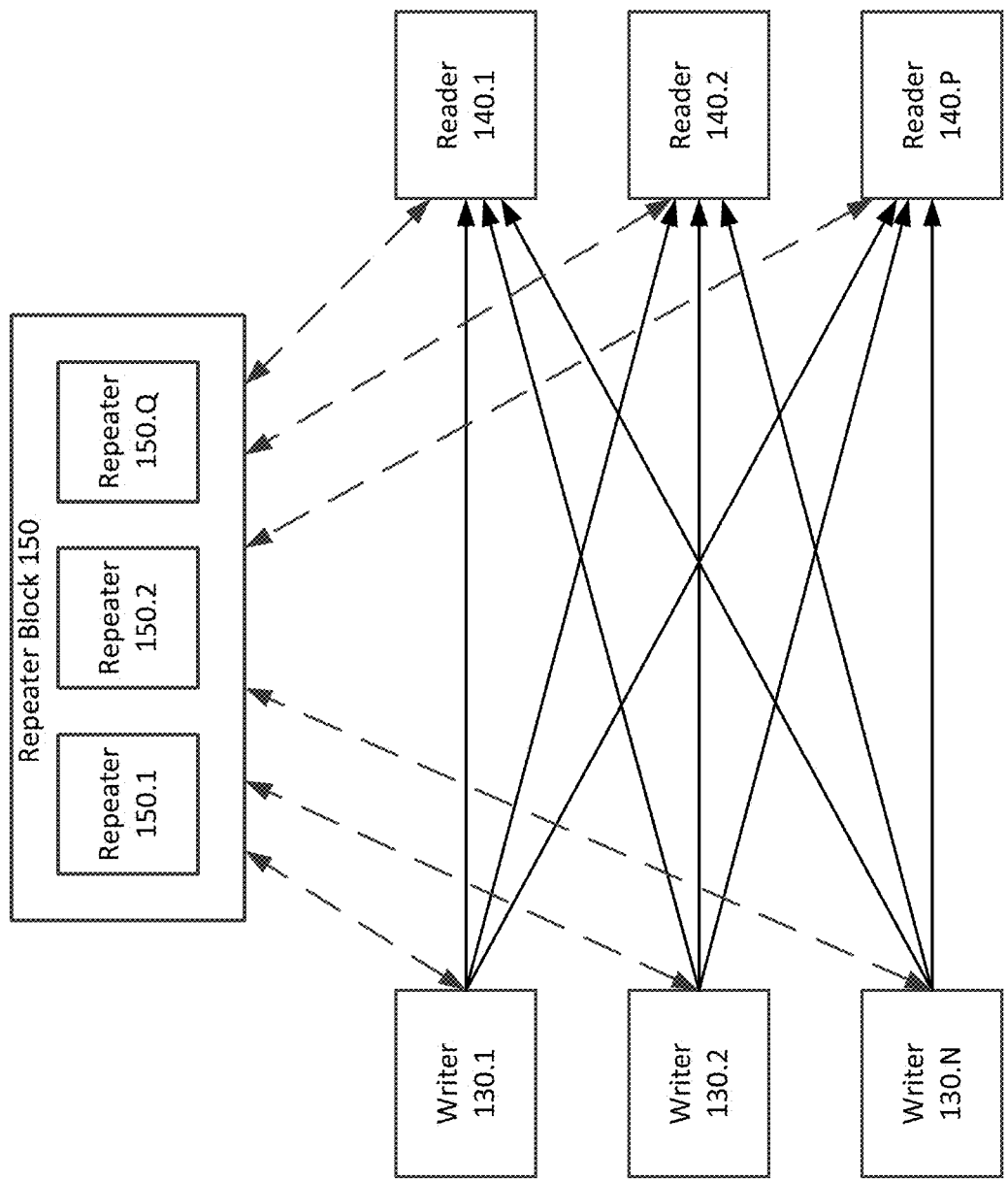
FIG. 1B is a block diagram illustrating a transport layer section of a distributed computing network in accordance with an embodiment of the invention.

Embodiments of the present invention pertain to distributed computing. In a distributed computing network, multiple nodes may be provided with each node handling processing responsibilities. The nodes may be located at different physical locations. The different nodes may communicate with each other using messages.

FIG. 1A is a block diagram illustrating part of a distributed computing network 100 in accordance with an embodiment of the invention. FIG. 1A may depict a logical illustration of the distributed computing network 100 in accordance with an embodiment of the invention. The distributed computing network 100 may include a plurality of applications 110.1-110.M (where M is a positive integer), a gateway 120, a plurality of writers 130.1-130.N (where N is a positive integer), and a plurality of readers 140.1-140.P (where P is a positive integer). The applications 110.1-110.M may provide interaction with end users. The applications 110.1-110.M may create/originate events, receive/consume events, and/or react to events.

The applications 110.1-110.M may communicate to other network entities of the distributed computing network 100 through the gateway 120 via a communication link. The communication link may be provided by one or more communication networks, such as the Internet. The communication network may include a wired or wireless local area network (LAN), a wide area network (WAN), a wireless personal area network (PAN), or any other type of communication networks. Computers may be connected over the Internet, an Intranet, Extranet, Ethernet, or any other system that provides communications. Some suitable communications protocols may include TCP/IP, UDP, or OSI for example. For wireless communications, communications protocols may include Bluetooth, Zigbee, IrDa or other suitable protocol. Furthermore, network entities may communicate with each other through a combination of wired or wireless paths.

A single gateway 120 is shown for illustration purposes although more than one gateway may be provided. The gateway 120 may receive messages from other network entities (e.g., writers, readers, applications) and forward those messages to other entities. The gateway 120 may control access to the system. The gateway 120 may perform validity checks on the messages and may also control the pace of message transmission. Therefore, the gateways may protect the distributed computing network 100 from cyber-attacks such as a denial-of-service attacks.

In one embodiment, the gateway 120 may employ an "N-in-flight" throttle, where N is a programmable throttle level, to control the pace of messages and to improve reliability. For example, if an application attempts to send a stream of ten messages to a writer and the throttle level N is set at one, the gateway 120 may allow only the first message to proceed and wait until it can verify that the first message was sequenced by reviewing the event stream from the readers. If the first message was processed appropriately, the gateway 120 may then send the remaining nine messages successively to the writer based on the current flow of messages in the system. In one embodiment, to increase throughput, the throttle level N may be set to a higher number. For example, the throttle level N may be set to three; in this example, the gateway 120 may send three messages from the application stream to the writer at a time.

The writers 130.1-130.N may be coupled to the gateway 120. In response to incoming messages from the applications 110.1-110.M, the writers 130.1-130.N may create outgoing messages relating to events. The writers 130.1-130.N may be globally time synchronized with each other. Hence, the writers 130.1-130.N may sequence the outgoing messages. The writers 130.1-130.N may timestamp the outgoing messages and may also attach a digital signature to the outgoing messages. The digital signatures may be public key digital signatures. The timestamps may be precisely synchronized based on a globally synchronized clock.

The writers 130.1-130.N may be coupled to the readers 140.1-140.P. Each reader 140.1-140.P may "listen" to one or more writers 130.1-130.N. Therefore, each reader 140.1-140.P may receive messages from multiple writers 130.1-130.N. Each reader 140.1-140.P may authenticate the digital signature on the messages for security purposes. And each reader 140.1-140.P may arrange messages received from different writers 130.1-130.N based on the timestamps in those messages to create a time-accurate event stream. Any two readers subscribing to the same set of writers may generate the same event stream ordering regardless of the physical locations of the readers and/or writers. Therefore, embodiments of the present invention improves the accuracy of distributed computing.

Furthermore, separating the different roles (e.g., writers and readers) distributes computational burdens across the network to allow each network entity to operate more efficiently. This improves the speed of the distributed computing network and thus increases throughput. For example, readers 140.1-140.P may not have to communicate with each other or perform other extraneous operations to slow down their generations of globally consistent event streams. The writers may also be freed from performing extraneous operations to slow down their generations of sequenced messages to be transmitted to the readers.

FIG. 1B is a block diagram illustrating a transport layer section of the distributed computing network 100 in accordance with an embodiment of the invention. As shown and discussed above, writers 130.1-130.N may communicate with readers 140.1-140.P in a unidirectional manner. The distributed computing network 100 may also include a repeater block 150, which includes one or more repeaters 150.1-150.Q. The repeater block 150 may be side channels from the writers 130.1-130.N and may be distributed throughout the network.

The repeaters 150.1-150.Q may include memory storage and may store outgoing messages of the writers 130.1-130.N. The repeaters 150.1-150.Q may be organized in a variety of ways. In one embodiment, the repeaters 150.1-150.Q may be memory-based and each repeater may correspond to a window of old outgoing messages. For example, one repeater may store the last hundred outgoing messages and another repeater may store the next hundred oldest outgoing messages and so on. In another embodiment, the repeaters 150.1-150.Q may be file-based, and the repeaters 150.1-150.Q may store outgoing messages based on files and applications to which the messages pertain. For example, one repeater may store the most recent messages for Application A and another repeater may store the most recent messages for Applications B and C and so on. In another embodiment, the repeaters may be organized as a combination of memory-based and file-based.

The data stored in the repeaters 150.1-150.Q may be structured, semi-structured, or unstructured. The data storage areas in the repeaters 150.1-150.Q may include file systems and databases for storing data. Data stored in the repeaters 150.1-150.Q may be managed and communicated with a database management system, as known in the art. The repeaters 150.1-150.Q may include multiple data storage areas, which may have different structures and store different types of data.

The readers 140.1-140.P may communicate with the repeaters 150.1-150.Q for requests of missing messages, as discussed in further detail below. If one of the repeaters 150.1-150.Q has the missing message, the appropriate repeater may transmit that message to the requesting reader. If, however, no repeater 150.1-150.Q has the missing message (after the repeaters have checked amongst themselves for the missing message), the appropriate repeater may transmit a retransmission request to the originating writer. In response, the originating writer may retransmit the missing message. In this embodiment, the readers 140.1-140.P may directly (without going through the gateway) send messages to the repeaters 150.1-150.P, but not the writers 130.1-130.N. The repeaters 150.1-150.P, if necessary, may directly send messages to the writers 130.1-130.N.

In one embodiment, the repeaters 150.1-150.P may be arranged in a hierarchy. And only the repeaters in the highest hierarchy may be allowed to directly send messages to the writers 130.1-130.N.

Separating the roles of readers and writers may also provide additional flexibility to the distributed computing network and allow the network to be dynamically updated. Membership of writers may be controlled by the current writers. For instance, pre-existing writers may add or delete other writers from the event stream. In one embodiment, if a writer physically fails, another writer with same logical address but different physical address may take the failed writer's physical place. In another example, if a writer is to be deleted, that soon-to-be-deleted writer may transmit an "end of sequence" message to its reader base. This "end of sequence" message may indicate to the reader base that this message will be the last message transmitted by that writer. This is another technique to add redundancy for devices in the distributed computing network, providing more flexibility. Also, readers may not need to communicate with each other and still may be kept up-to-date with the writer membership list. This improves the speed of the distributed computing network.

As described above, each writer may generate an individual event stream. In one embodiment, the messages from the writers (i.e., individual event stream) may be stored in a remote storage unit, for example a cloud storage. The remote storage unit may also store a history of readers' subscription list of writers. Therefore, a replay of a reader's past operation (i.e., what messages the reader saw) may be reconstructed. In one embodiment, the remote storage unit may be integrated with the repeater block components.

In one embodiment of the present invention, messages may be organized by topics, where topics may be designated by associated tags or strings. Thus, a reader may filter the messages received from different writers based on a topic. A single topic may be shared among one or more writers. The topics may be maintained in one or more databases. In one embodiment, the topic database(s) may be located in a central location; alternatively, the topic database(s) may be provided in a decentralized fashion.

When a new topic is created, a corresponding entry may be stored in the topic database(s). The stored entry may include a string that defines that topic, the identity of the first writer to publish a message under that topic, and the sequence number of that message (relative to that writer).

In one embodiment, if a writer wishes to join an already existing topic, this may be announced by a writer who is already writing to that topic. The new writer may wait to see this announcement made before publishing any messages on that topic, which ensures that all readers subscribed to the topic will consume the time-stamped announcement and know to begin following the new writer from that time stamp going forward. This may be instantiated, for example, by having a source announcement topic associated with each topic. Writers who are already associated with a topic may make announcements adding other writers when prompted by a request from the new writer as well as under other circumstances. Writers may also remove themselves from a topic, and may do so by making a removal announcement. A writer who has removed itself will no longer publish messages under that topic (unless it is later re-added to the topic). These mechanisms ensure that any two readers who both subscribe to a set of topics will agree on the exact sequence of messages produced in those topics.

A "topic creation" tool may be used to inform readers of new topics as they are created. In one embodiment, a reader may maintain a criteria (e.g., an expression on strings) for topics of interest. Thus, when any newly created topic is announced, it can be checked against the criterion of the reader to allow it to decide whether or not to consume the new topic.

The distributed computing network, as described herein, may have various uses. For example, the distributed computing network may be used for global clearing settlement systems. Embodiments of the present invention, as described herein, may be used with online gaming, global matching engines, military applications, clearing houses, Internet of things, digital currency, micropayments, synchronizing applications on different cloud platforms, etc.

FIG. 2 illustrates a writer 130 in accordance with an embodiment of the present invention. The writer 130 may include a lead machine 220, and a cache 230. The writer 130 may receive incoming messages from the gateway that may originate from applications. The lead machine 220 may include a processor 220.1 and a clock 220.2. The processor 220.1 may authenticate digital signatures of incoming messages. The processor 220.1 may generate new outgoing messages and attach the digital signature of writer 130 to the outgoing messages, as described in further detail below. The clock 220.2 may be provided as a high-precision clock used to create the timestamp for outgoing messages from the writer 130. The clock 220.2 may be globally synchronized with clocks of other writers. In one embodiment, the clocks of the writers may be synchronized using the Network Time Protocol (NTP).

The cache 230 may include memory storage and may store outgoing messages of the writer 130. In the (rare) situations when a repeater requests a retransmission of the message, the cache 230 may handle that request and retransmit the requested message.

The writer 130 may transmit outgoing messages to readers/repeaters. In one embodiment, the outgoing messages may be broadcast and any receiver may be able to receive the outgoing messages. In another embodiment, the outgoing messages may be specifically targeted to one or more readers, and only the targeted readers may be able to receive those messages (in addition to the repeater(s)). The writer 130 may also transmit the writer's "heartbeat" to the readers periodically. The heartbeat, along with sequence numbers, may be used by the readers to confirm that it is still in communication with the writer and that no message from that writer has been inadvertently lost. For example, if a listening reader does not receive a message from a designated writer but does receive that writer's heartbeat in the same time period, that reader may presume that the writer had no message to transmit in that time period.

FIG. 3 illustrates a flow diagram of generating and transmitting a message from a writer in accordance with an embodiment of the present invention. In one embodiment, the method of FIG. 3 may be performed by the writer 130 of FIGS. 1 and 2, or alternatively, it may be performed by another device. In step 310, the writer 130 may receive a message from gateway 120, to which it is coupled.

In step 320, the writer 130 may authenticate the digital signature to verify the sender of the incoming message. In step 330, the writer 130 may generate the new outgoing message in step 340. The incoming message may have been multicast from the application to the writer via the gateway. The incoming message may be un-sequenced. In step 340, the writer 130 may attach its writer ID to the message. The writer ID may be a unique ID for each writer. In step 340, the writer 130 may attach a sequence number to the message. The sequence number may be a monotonically increasing number that is incremented after each message. In step 360, the writer 130 may attach a time stamp to the message. The message may be time-stamped by a high-precision global clock. All writers in the distributed computing network may use the same type of high-precision global clock to ensure consistent event ordering.

In step 370, the writer 130 may generate a unique digital signature for the message and attach the digital signature to the message. The digital signature for the writer may be based on one or more of the following: message content (including the incoming message body from the application and/or gateway signature on incoming message), writer ID, sequence number, and time stamp. The digital signature may be unique for each message and may be used by recipients of the outgoing message to verify the authenticity of the outgoing message.

In step 380, the message may be stored in the local cache of the writer 130. In step 390, the writer may transmit the outgoing message to one or more readers (and repeater(s)). The writer may broadcast the outgoing message or may directly transmit the outgoing message to one or more readers.

Figure 4A:
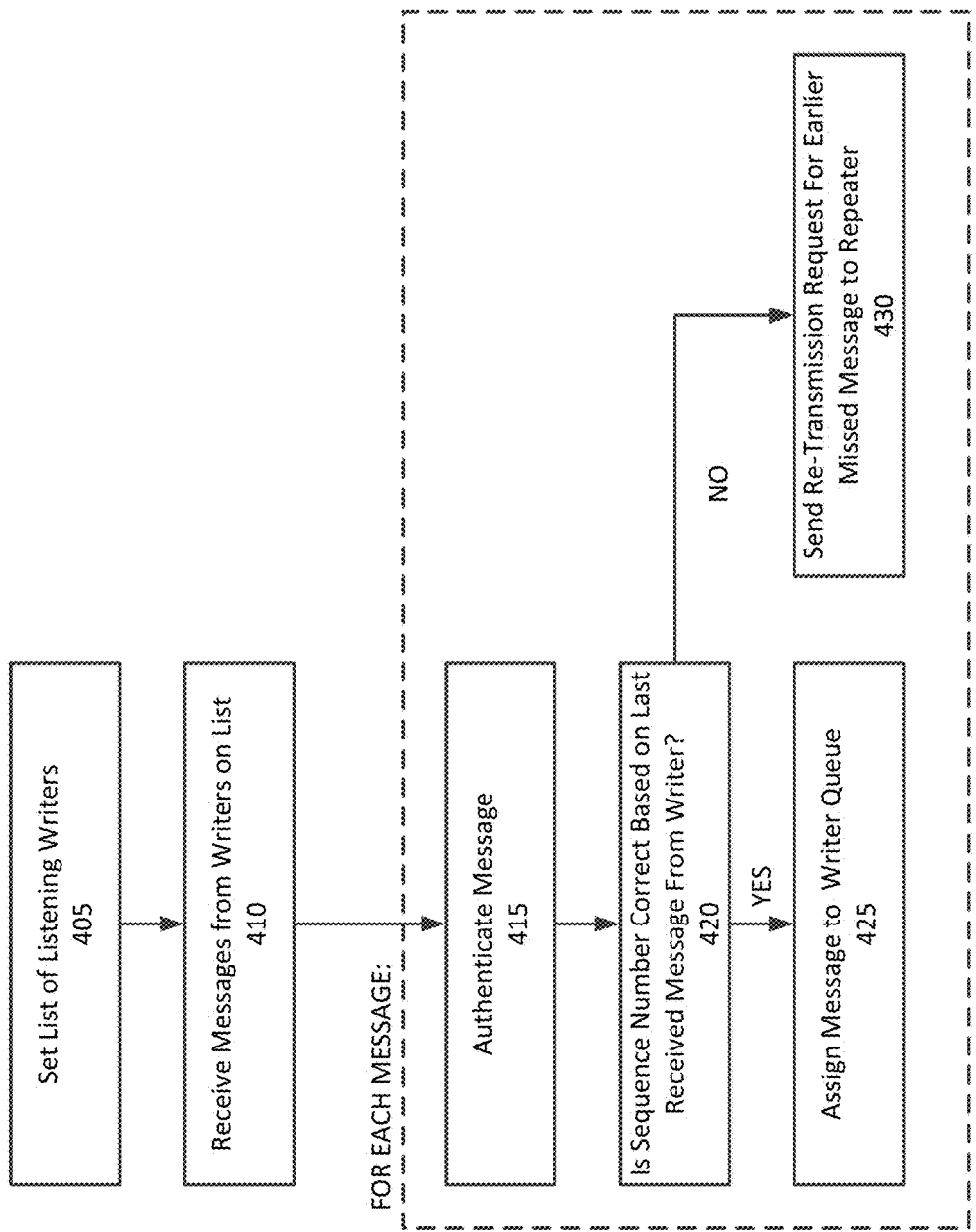
FIG. 4A-4B are flow diagrams of operations of a reader device in accordance with an embodiment of the present invention.

FIG. 4A illustrates a flow diagram of receiving messages in accordance with an embodiment of the present invention. In one embodiment, the method of FIG. 4A may be performed by one of the readers 140.1-140.P of FIG. 1, or alternatively, it may be performed by another device. In step 405, the reader may set a list of writers to which it will listen. The writers on the list may be distributed across different locations in the distributed computing network. In step 410, the reader may receive messages from the writers on its list. In addition, the reader may also receive heartbeats from the writers on its list.

For each received message, the reader may perform the following steps: in step 415, the reader may authenticate the digital signatures on the received messages to verify that the messages did indeed originate from the designated writers. In step 420, the reader may check the sequence number attached to the message to determine if the sequence number is correct based on the last received message from the same originating writer. If the sequence number is correct (i.e., the next sequence number after the sequence number of the last message from the same writer), then the reader, in step 425, may assign the message to the queue for the originating writer. The reader may include a plurality of queues, one for each writer on its list. If the sequence number is incorrect (i.e., not the next sequence number after the sequence number of the last message from the same writer), then reader may presume it missed message(s) corresponding to the gap sequence numbering. Therefore, in step 430, the reader may transmit a request for the missed message(s) to the appropriate repeater. The repeater may directly send the message to the appropriate reader. Actions taken by the repeater in response to the retransmission request is described above.

Figure 4B:
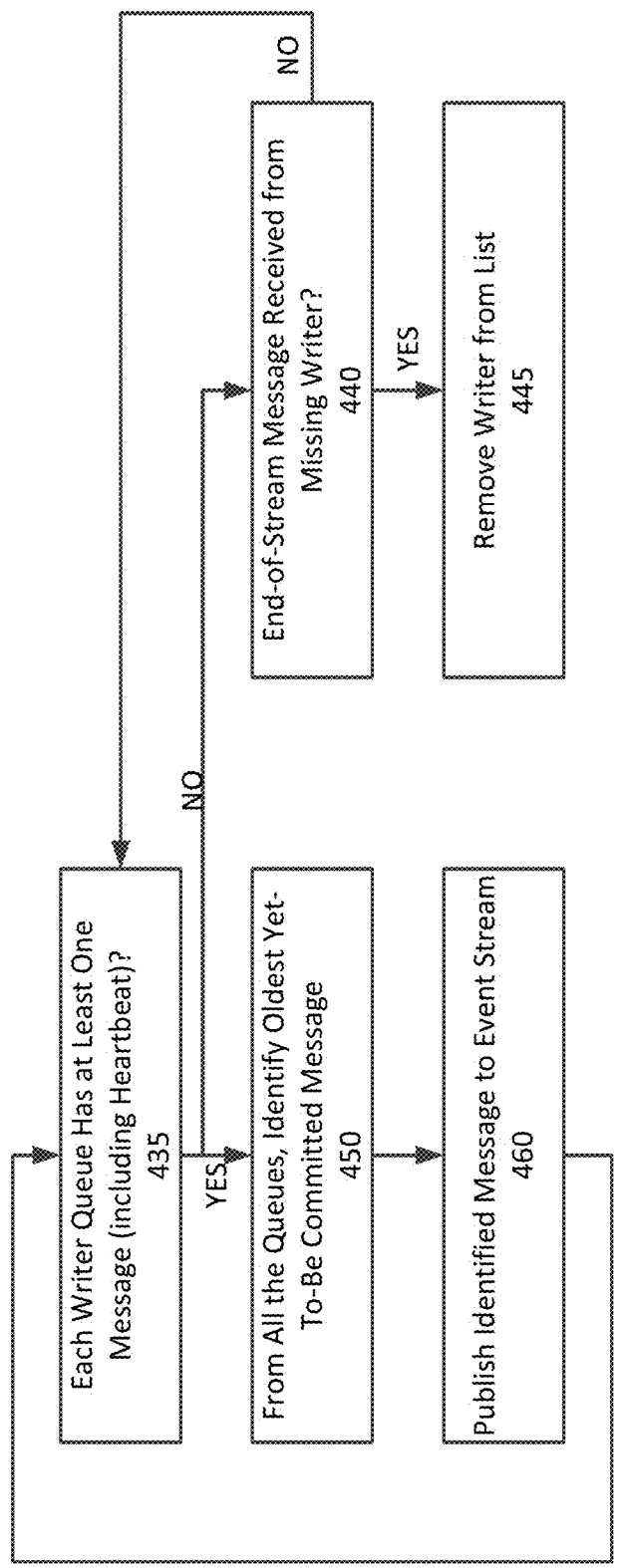

FIG. 4B illustrates a flow diagram of generating an event stream in accordance with an embodiment of the present invention. In one embodiment, the method of FIG. 4B may be performed by one of the readers 140.1-140.P of FIG. 1, or alternatively, it may be performed by another device. In step 435, the reader may check if each writer queue has at least one message (including heartbeats). If yes, the reader, in step 440, may identify the oldest yet-to-be committed message (not including heartbeats) from the queues. In step 445, the reader may publish the identified oldest yet-to-be committed message to the event stream. The method may then return to step 435.

If, however, in step 435 not all writer queues had at least one message (including heartbeats), then the reader, in step 450, may check if an "end of stream" message is received from the writer(s) with no message in its respective queue. If no "end of stream" message is received, the method may return to step 435 and wait for either a content message, heartbeat, or "end of stream" message from that writer to be received. If an "end of stream" message is received, the reader, in step 455, may remove that writer from its list and return to step 435.

FIG. 5 illustrates an example of a reader operation of receiving messages and rearranging them in proper chronological order in accordance with an embodiment of the present invention. In this example, two readers 520, 550 may subscribe to the same five writers (A-E). However, the two readers may receive the messages from the writers in different order due, for example, to the readers being at different locations. Messages from a writer closer to a reader may be received faster than a messages from a writer further away from the reader. In this example, reader 520 may receive the messages in the following received order 510: 1) message from writer A; 2) message from writer B; 3) message from writer C; 4) message from writer D; and 5) message from writer E. In contrast, reader 550 may receive the messages in the following received order 540: 1) message from writer B; 2) message from writer C; 3) message from writer A; 4) message from writer E; and 5) message from writer D. However, after the readers 520, 550 check the timestamps for when the received messages were created, the readers 520, 550 may rearrange the messages with the earliest time-stamped message first and the latest time-stamped message last. Both readers 520, 550 may rearrange the messages in the same order for the event stream 530: 1) message from writer C; 2) message from writer E; 3) message from writer A; 4) message from writer D; and 5) message from writer B. Thus, any two readers subscribing to the same writers may generate the same event stream.

In one embodiment, encryption may also be used to transmit the messages between the network entities. Encryption may be separate from, and complementary to, the authentication provided by the use of digital signatures, as described herein. In one embodiment, some network entities need not have the encryption key to perform its functions. For example, a reader may receive and arrange the messages in encrypted form for the event stream. For the reader, it may not matter if the message is encrypted or not. To view the information in the messages of the event stream, the application may require the encryption key to decrypt the messages. This provides an additional layer of security to the distributed computing network.

In one embodiment, "checkpointing" may be used. Checkpointing may allow a reader to begin reconstructing the event stream from a particular checkpoint rather than starting from the beginning of the event sequence. This may allow faster reconstruction of the event stream, thus improving the speed of recovery in the distributed computing network.

The above-described techniques may protect the distributed computing network from certain adverse effects of clock drift. Errors in clock drift will not change the fact that all readers will see the same time stamp on each message, and hence clock drift may not generate disputes about the order of the messages. This improves the accuracy of the distributed computing network.

Generally, it should be noted that the components depicted and described herein above may be, or include, a computer or multiple computers. The components may be described in the general context of computer-executable instructions, such as program modules, being executed by a computer. Generally, program modules include routines, programs, objects, components, data structures, etc., that perform particular tasks or implement particular abstract data types.

Those skilled in the art will appreciate that the invention may be practiced with various computer system configurations, including hand-held wireless devices such as mobile phones or PDAs, multiprocessor systems, microprocessor-based or programmable consumer electronics, minicomputers, mainframe computers, and the like. As described above, the invention may be practiced in distributed computing environments where tasks are performed by remote processing devices that are linked through a communications network. In a distributed computing environment, program modules may be located in both local and remote computer storage media including memory storage devices.

Computers typically include a variety of computer readable media that can form part of the system memory and be read by the processing unit. By way of example, and not limitation, computer readable media may comprise computer storage media and communication media. The system memory may include computer storage media in the form of volatile and/or nonvolatile memory such as read only memory (ROM) and random access memory (RAM). A basic input/output system (BIOS), containing the basic routines that help to transfer information between elements, such as during start-up, is typically stored in ROM. RAM typically contains data and/or program modules that are immediately accessible to and/or presently being operated on by a processing unit. The data or program modules may include an operating system, application programs, other program modules, and program data. The operating system may be or include a variety of operating systems such as Microsoft Windows® operating system, the Unix operating system, the Linux operating system, the Xenix operating system, the IBM AIX™ operating system, the Hewlett Packard UX™ operating system, the Novell Netware™ operating system, the Sun Microsystems Solaris™ operating system, the OS/2™ operating system, the BeOS™ operating system, the Macintosh™® operating system, the Apache™ operating system, an OpenStep™ operating system or another operating system of platform.

At minimum, the memory includes at least one set of instructions that are either permanently or temporarily stored. The processor executes the instructions that are stored in order to process data. The set of instructions may include various instructions that perform a particular task or tasks, such as those shown in the appended flowcharts. Such a set of instructions for performing a particular task may be characterized as a program, software program, software, engine, module, component, mechanism, or tool. A computer may include a plurality of software processing modules stored in a memory as described above and executed on a processor in the manner described herein. The program modules may be in the form of any suitable programming language, which is converted to machine language or object code to allow the processor or processors to read the instructions. That is, written lines of programming code or source code, in a particular programming language, may be converted to machine language using a compiler, assembler, or interpreter. The machine language may be binary coded machine instructions specific to a particular computer.

Any suitable programming language may be used in accordance with the various embodiments of the invention. Illustratively, the programming language used may include assembly language, Ada, APL, Basic, C, C++, COBOL, dBase, Forth, FORTRAN, Java, Modula-2, Pascal, Prolog, REXX, and/or JavaScript for example. Further, it is not necessary that a single type of instruction or programming language be utilized in conjunction with the operation of the system and method of the invention. Rather, any number of different programming languages may be utilized as is necessary or desirable.

In addition, the instructions and/or data used in the practice of the invention may utilize any compression or encryption technique or algorithm, as may be desired. An encryption module might be used to encrypt data. Further, files or other data may be decrypted using a suitable decryption module.

The computing environment may also include other removable/nonremovable, volatile/nonvolatile computer storage media. For example, a hard disk drive may read or write to nonremovable, nonvolatile magnetic media. A magnetic disk drive may read from or write to a removable, nonvolatile magnetic disk, and an optical disk drive may read from or write to a removable, nonvolatile optical disk such as a CD ROM or other optical media. Other removable/nonremovable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The storage media is typically connected to the system bus through a removable or non-removable memory interface.

The processing unit that executes commands and instructions may be a general purpose computer, but may utilize any of a wide variety of other technologies including a special purpose computer, a microcomputer, mini-computer, mainframe computer, programmed micro-processor, micro-controller, peripheral integrated circuit element, a CSIC (Customer Specific Integrated Circuit), ASIC (Application Specific Integrated Circuit), a logic circuit, a digital signal processor, a programmable logic device such as an FPGA (Field Programmable Gate Array), PLD (Programmable Logic Device), PLA (Programmable Logic Array), RFID processor, smart chip, or any other device or arrangement of devices capable of implementing the steps of the processes of the invention.

It should be appreciated that the processors and/or memories of the computer system need not be physically in the same location. Each of the processors and each of the memories used by the computer system may be in geographically distinct locations and be connected so as to communicate with each other in any suitable manner. Additionally, it is appreciated that each of the processors and/or memories may be composed of different physical pieces of equipment.

A user may enter commands and information into the computer through a user interface that includes input devices such as a keyboard and pointing device, commonly referred to as a mouse, trackball or touch pad. Other input devices may include a microphone, joystick, game pad, satellite dish, scanner, voice recognition device, keyboard, touch screen, toggle switch, pushbutton, or the like. These and other input devices are often connected to the processing unit through a user input interface that is coupled to the system bus, but may be connected by other interface and bus structures, such as a parallel port, game port or a universal serial bus (USB).

One or more monitors or display devices may also be connected to the system bus via an interface. In addition to display devices, computers may also include other peripheral output devices, which may be connected through an output peripheral interface. The computers implementing the invention may operate in a networked environment using logical connections to one or more remote computers, the remote computers typically including many or all of the elements described above.

Various networks may be implemented in accordance with embodiments of the invention, including a wired or wireless local area network (LAN) and a wide area network (WAN), wireless personal area network (PAN) and other types of networks. When used in a LAN networking environment, computers may be connected to the LAN through a network interface or adapter. When used in a WAN networking environment, computers typically include a modem or other communication mechanism. Modems may be internal or external, and may be connected to the system bus via the user-input interface, or other appropriate mechanism. Computers may be connected over the Internet, an Intranet, Extranet, Ethernet, or any other system that provides communications. Some suitable communication protocols may include TCP/IP, UDP, or OSI, for example. For wireless communications, communications protocols may include Bluetooth, Zigbee, IrDa or other suitable protocol. Furthermore, components of the system may communicate through a combination of wired or wireless paths.

Although many other internal components of the computer are not shown, those of ordinary skill in the art will appreciate that such components and the interconnections are well known. Accordingly, additional details concerning the internal construction of the computer need not be disclosed in connection with the present invention.

It should also be readily apparent to one of ordinary skill in the art that the presently disclosed invention may be implemented in a wide range of industries. The various embodiments and features of the presently disclosed invention may be used in any combination, as the combination of these embodiments and features are well within the scope of the invention. While the foregoing description includes many details and specificities, it is to be understood that these have been included for purposes of explanation only, and are not to be interpreted as limitations of the present invention. It will be apparent to those skilled in the art that other modifications to the embodiments described above can be made without departing from the spirit and scope of the invention. Accordingly, such modifications are considered within the scope of the invention as intended to be encompassed by the following claims and their legal equivalent.

From the foregoing, it will be seen that this invention is one well adapted to attain all the ends and objects set forth above, together with other advantages, which are obvious and inherent to the system and method. It will be understood that certain features and sub-combinations are of utility and may be employed without reference to other features and sub-combinations. This is contemplated and within the scope of the appended claims.

The invention claimed is:

1. A distributed computing system, comprising:
a plurality of writers, each writer to generate messages and attach a timestamp to the messages;
a plurality of readers that are separate from the plurality of writers, at least one reader to subscribe to at least two writers of the plurality of writers and the at least one reader to receive messages from the at least two writers to which it is subscribed and to generate an event stream by arranging the messages from the at least two writers in chronological order based on the timestamps attached to the messages; and
a gateway to communicatively couple an end-user application to at least one writer of the plurality of writers, the gateway being configured to control a pace of a message stream from the end-user application to the at least one writer such that no more than a specified maximum number of messages from the end-user application are being processed collectively by the plurality of writers and the plurality of readers at any given time.

2. The system of claim 1, wherein the gateway is further configured to forward a next message to the at least one writer upon confirming that the plurality of readers have finished processing a previously forwarded message from the end-user application.

3. The system of claim 1, where the end-user application transmits a message to the at least one writer via the gateway.

4. The system of claim 1, wherein the specified maximum number is one.

5. The system of claim 1, wherein the specified maximum number is a positive integer N that is greater than one.

6. The system of claim 1, wherein the specified maximum number is adjustable.

7. The system of claim 1, wherein each writer attaches a unique digital signature to a message.

8. The system of claim 7, wherein the digital signature is based on one or more of the following: the timestamp, message content, writer ID, and sequence number.

9. The system of claim 1, wherein each writer further attaches a unique writer ID and a sequence number to a generated message.

10. The system of claim 1, wherein one of the plurality of writers is configured to add a new writer to the plurality of writers.

11. The system of claim 1, wherein one of the plurality of writers is configured to delete a writer from the plurality of writers.

12. The system of claim 1, wherein the plurality of writers are configured to periodically transmit a heartbeat.

13. A method for distributed computing, comprising:
receiving, by a gateway device, a stream of incoming messages from an end-user application;
forwarding said stream of incoming messages to a plurality of writers;
causing the plurality of writers to generate messages based on said stream of incoming messages, wherein a timestamp is attached to each of said generated messages;
providing a plurality of readers that are separate from the plurality of writers;
causing at least one reader of the plurality of readers to subscribe to at least two writers of the plurality of writers, to receive messages from the at least two writers, and to generate an event stream by arranging the generated messages from the at least two writers in chronological order based on timestamps attached to the generated messages; and
causing the gateway device to control a pace of the stream of incoming messages from the end-user application which are forwarded to the plurality of writers such that no more than a specified maximum number of incoming messages from the end-user application are being processed collectively by the plurality of writers and the plurality of readers at any given time.

14. The method of claim 13, wherein the gateway device is further configured to forward a next message to at least one of the plurality of writers upon confirming that the plurality of readers have finished processing a previously forwarded incoming message from the end-user application.

15. The method of claim 13, where the end-user application transmits each incoming message to at least one of the plurality of writers via the gateway device.

16. The method of claim 13, wherein the specified maximum number is one.

17. The method of claim 13, wherein the specified maximum number is a positive integer N that is greater than one.

18. The method of claim 13, wherein the specified maximum number is adjustable.

19. The method of claim 13, wherein each writer attaches a unique digital signature to a generated message.

20. The method of claim 19, wherein the digital signature is based on one or more of the following: the timestamp, message content, writer ID, and sequence number.

21. The method of claim 13, wherein each writer further attaches a unique writer ID and a sequence number to a generated message.

22. The method of claim 13, wherein one of the plurality of writers is configured to add a new writer to the plurality of writers.

23. The method of claim 13, wherein one of the plurality of writers is configured to delete a writer from the plurality of writers.

24. The method of claim 13, wherein the plurality of writers are configured to periodically transmit a heartbeat.

* * * * *